United States Patent [19]
Fulford, Jr. et al.

[11] Patent Number: 5,915,195
[45] Date of Patent: Jun. 22, 1999

[54] ION IMPLANTATION PROCESS TO IMPROVE THE GATE OXIDE QUALITY AT THE EDGE OF A SHALLOW TRENCH ISOLATION STRUCTURE

[75] Inventors: H. Jim Fulford, Jr.; Charles E. May, both of Austin, Tex.

[73] Assignee: Advanced Micro Devices, Inc.

[21] Appl. No.: 08/977,795

[22] Filed: Nov. 25, 1997

[51] Int. Cl.$^6$ ................................................ H01L 21/265
[52] U.S. Cl. .......................... 438/524; 438/525; 438/528
[58] Field of Search ................................. 438/524, 528, 438/525, 702, 407, 413, 424, 425, 426, 700, FOR 158, FOR 169

[56] References Cited

U.S. PATENT DOCUMENTS

| | | | |
|---|---|---|---|
| 4,666,178 | 5/1987 | Soclof ...................................... | 438/524 |
| 4,693,781 | 9/1987 | Leung et al. . | |
| 4,756,793 | 7/1988 | Peek ........................................ | 438/525 |
| 5,047,359 | 9/1991 | Nagatomo ............................... | 438/524 |
| 5,057,446 | 10/1991 | Fuse et al. ............................... | 438/524 |
| 5,112,762 | 5/1992 | Anderson et al. ....................... | 438/525 |
| 5,118,636 | 6/1992 | Hosaka ...................................... | 438/0 |
| 5,406,111 | 4/1995 | Sun ......................................... | 438/524 |
| 5,637,529 | 6/1997 | Jang et al. . | |
| 5,643,822 | 7/1997 | Furukawa et al. ....................... | 438/524 |
| 5,780,353 | 7/1998 | Omid-Zohoor .......................... | 438/524 |

FOREIGN PATENT DOCUMENTS

| | | | |
|---|---|---|---|
| 2-2116 | 1/1990 | Japan ............................. | 438/FOR 169 |
| 5-343515 | 12/1993 | Japan ............................. | 438/FOR 169 |

OTHER PUBLICATIONS

Patent Abstracts of Japan vol. 095, No. 007, published Aug. 31, 1995.
International Search Report for PCT/US98/10179 dated Aug. 9, 1998.
Wolf, Stanley, Ph.D., *Silicon Processing for the VLSI ERA, vol. 1: Process Technology*, 1986 by Lattice Press, p. 183.

*Primary Examiner*—John F. Niebling
*Assistant Examiner*—S. Mulpuri
*Attorney, Agent, or Firm*—Kevin L. Daffer; Conley, Rose & Tayon

[57] ABSTRACT

A semiconductor fabrication process comprising forming a dielectric on an upper surface of a single crystal silicon substrate. A trench mask is then patterned on an upper surface of the dielectric. The trench mask exposes portions of the dielectric situated over portions of the isolation region. Exposed portions of the dielectric are then removed and portions of the silicon within the isolation region are also removed to form an isolation trench within the silicon substrate. This formation results in the formation of corners in the silicon substrate where the upper surface of the silicon substrate intersects with sidewalls of the isolation trench. Localized damage is then created in regions proximal to these corners of the silicon substrate preferably through the use of one or more ion implantation processes performed at implant angles in excess of approximately 30° C. During the subsequent formation of a liner oxide on the sidewalls and floor of the isolation trench, the localized damage region results in a higher oxidation rate of the silicon substrate proximal to the silicon substrate corners. This higher oxidation rate results in a rounding or smoothing of the silicon corners thereby resulting in a less severe gradient between the silicon active region and the isolation trench.

11 Claims, 2 Drawing Sheets

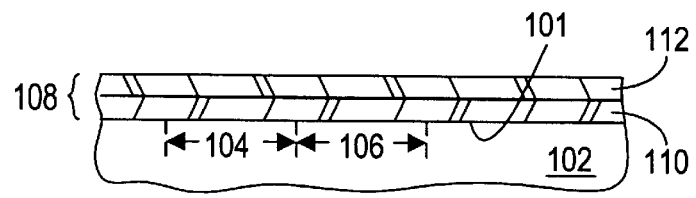
FIG. 1
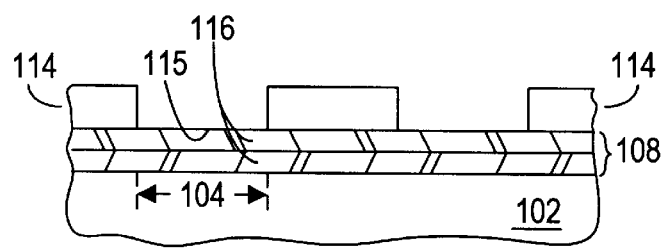
FIG. 2
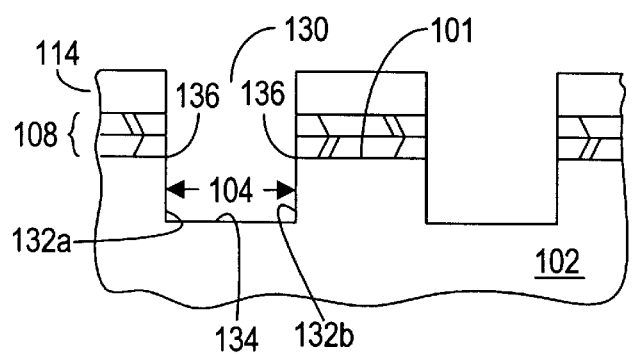
FIG. 3
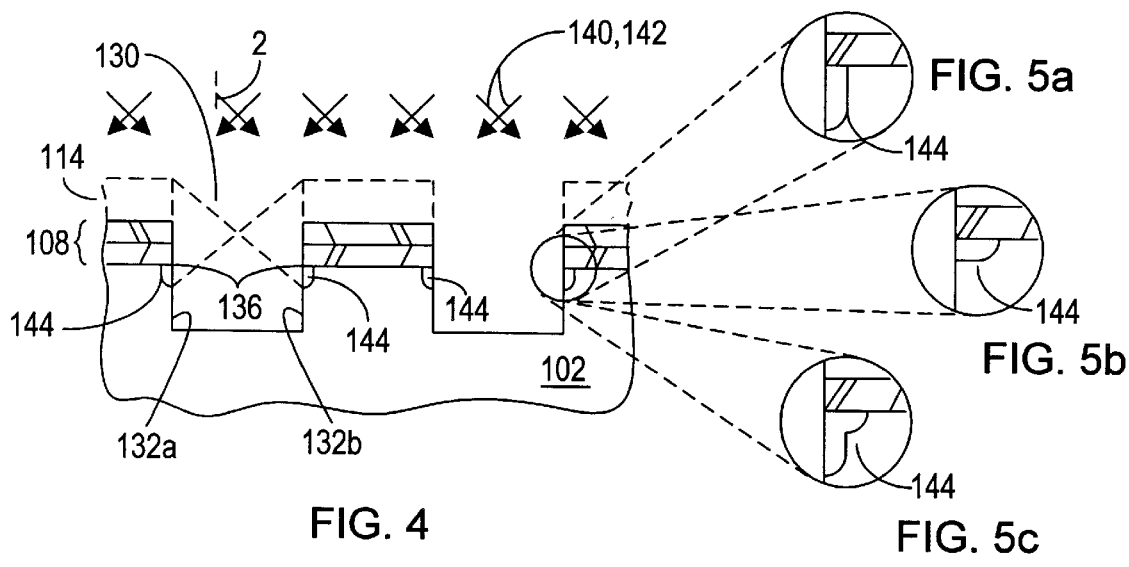
FIG. 4
FIG. 5a
FIG. 5b
FIG. 5c

ION IMPLANTATION PROCESS TO IMPROVE THE GATE OXIDE QUALITY AT THE EDGE OF A SHALLOW TRENCH ISOLATION STRUCTURE

BACKGROUND OF THE INVENTION

1. Field of the Invention

The present invention relates to the field of semiconductor processing and more particularly to a method of improving transistor reliability by fabricating a gate dielectric film in which the gate dielectric thickness is increased proximal to the isolation regions to reduce the electric field in these regions.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 microns, the limitations of conventional transistor processing become more apparent. To combat short channel effects in deep sub-micron transistors, the depth of the source/drain junctions and the thickness of the gate oxides must be reduced. Devices become more susceptible, however, to breakdown due to electrical stress across the oxide. In a conventional sub-half-micron transistor, for example, gate dielectric thickness in the range of approximately 50 angstroms is not uncommon. If a 3.3 volt potential is applied across this film, a common occurrence in MOS transistors, is the resulting electrical field has a nominal value in the range of approximately 3.3 MV/cm. In regions of the underlying gate dielectric proximate to geometric discontinuities, a localized electric field can greatly exceed the nominal value and can cause dielectric breakdown. Accordingly, it has been theorized that the gate dielectric is more likely to breakdown in regions of the device adjacent or proximal to isolation structures and, more particularly, shallow trench isolation structures, where elevational discontinuities in the underlying substrate are common and can result in electrical fields exceeding 6 MV/cm, which is considered to be an upper limit on the electrical field sustainable by a thermally formed $SiO_2$ film. See, e.g., S. Wolf & R. Tauber, *Silicon Processing for the VLSI Era* 183 (Lattice Press 1986).

Despite the problems associated with dielectrics in general, thin gate dielectrics are desirable in the active regions of a device because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit.

Therefore, it would be highly desirable to implement a process in which a thin gate dielectric layer is not subjected to excessive electric fields in the immediate vicinity of the shallow trench isolation structures.

SUMMARY OF THE INVENTION

The problems identified above are in large part addressed by a semiconductor fabrication process in which localized regions of lattice damage are created at the surface of the silicon substrate adjacent to the sidewalls of a shallow trench isolation structure. These regions of localized lattice damage are oxidized at a faster rate than the silicon substrate in the active portions of the substrate. The differential oxidation rate tends to reduce the severity of the corner at the shallow trench isolation edge causing a rounding of the active area adjacent the isolation structure. It is theorized that the rounded silicon substrate neighboring the isolation structure tends to reduce the electric field generated at the edge of the active region and is compatible with the formation of a higher quality gate oxide, thereby improving the reliability of a subsequently formed integrated circuit transistor.

Broadly speaking, the present invention contemplates a semiconductor fabrication process in which a dielectric is formed on an upper surface of a single crystal silicon substrate and a trench mask is patterned on an upper surface of the dielectric. The silicon substrate includes at least one isolation region and at least one active region which is laterally displaced with respect to the isolation region. The patterned trench mask exposes portions of the dielectric that are situated over the isolation region of the silicon substrate. These exposed portions of the dielectric are then removed to expose an upper surface of the isolation region of the silicon substrate. Portions of the isolation region are then removed to form an isolation trench within the silicon substrate. The formation of the isolation trench produces corners in the silicon substrate. These corners are located in close proximity to the upper surface of the silicon substrate proximal to the sidewalls of the isolation trench. Thereafter, localized damage to the corners of the silicon substrate is created and a liner oxide is then formed on the sidewalls and floor of the isolation trench with a thermal oxidation process. Because of the localized damage created in the preceding processing step, an oxidation rate of the silicon substrate is greater in the regions of localized damage than in the remaining portions of the silicon substrate. In this manner, the thermal oxidation process tends to substantially reduce or eliminate the corners of the silicon substrate, resulting in a rounded transition where the silicon substrate upper surface intersects with the isolation trench sidewall. Thereafter, the isolation trench is filled with an isolation dielectric, typically comprised of, for example, a chemically vapor deposited silicon dioxide.

Preferably, a starting material for the silicon substrate includes a p-type epitaxial layer formed on a p+ silicon bulk. A resistivity of the epitaxial layer is preferably in the range of approximately 10 to 15 $\Omega$-cm. In one embodiment, the dielectric comprises a chemically vapor deposited silicon dioxide layer. In another embodiment, the dielectric layer further includes a silicon nitride layer deposited on top of the chemically vapor deposited silicon dioxide layer. Preferably, the patterned trench mask comprises a patterned layer photoresist produced with a conventional photolithography/photoresist process. The creation of the localized regions of damage, in one presently preferred embodiment, is accomplished by using at least one ion implantation process. In such an embodiment, the ion implantation process utilizes an implant species comprising an electrically inactive element of sufficient atomic mass to create localized regions of damage. Suitable implant species compatible with these requirements include, for example, silicon, germanium, or argon. Preferably, the ion implantation process is performed with an implant energy in the range of approximately 50 to 200 keV. The ion implantation process is preferably performed at an implant angle in excess of approximately 30° from an angle perpendicular to the substrate upper surface. The angled implant confines the localized damage regions to portions of the silicon substrate near the upper surfaces of the isolation trench sidewalls.

In one embodiment, the creation of the localized damage regions is accomplished using a first set of ion implantation processes performed at an implant angle in excess of approximately 30° wherein the first set of implantation processes is performed with the patterned mask used to form the mask remaining in place upon the dielectric layer. Thereafter, a second set of ion implantation processes is performed at an implant angle in excess of approximately 30° after removing the patterned mask, but prior to removing the dielectric layer. The formation of the liner oxide is preferably accomplished by immersing the silicon substrate in an oxygen bearing ambient maintained at a temperature in the range of approximately 500° C. to 900° C. for a duration in the range of approximately 2 to 20 minutes. In one embodiment, the oxygen bearing ambient used to produce the liner oxide may further comprise a nitrogen bearing species to incorporate nitrogen into the liner oxide. In one embodiment, the process of the present invention further includes the steps of planarizing the isolation dielectric and removing the dielectric layer from the silicon substrate outside the trench isolation areas to expose upper surfaces of the silicon substrate over the active region. After performing well known silicon preparation and cleaning steps, a gate oxide layer is formed on the active regions of the silicon substrate by immersing the substrate into an oxygen bearing ambient maintained at a temperature in the range of approximately 500° C. to 900° C. for a duration in the range of approximately 2 to 20 minutes to form a gate dielectric. The oxygen bearing ambient used to form the gate dielectric layer may, in one presently preferred embodiment, further include a nitrogen bearing species to advantageously incorporate the barrier and other desirable properties associated with nitrogen into the gate oxide.

The present invention still further contemplates a semiconductor process for rounding the corners of a silicon substrate. The corners comprise the portions of the silicon substrate in close proximity to an intersection between an upper surface of the silicon substrate active region and sidewalls of the isolation trench within the silicon substrate. Accordingly, the corners comprise portions of the silicon substrate proximal to an upper surface of the silicon substrate and further proximal to sidewalls of an isolation trench formed in the silicon substrate. The rounding process, according to the present invention, includes forming a protective layer over the active regions of the silicon substrate, creating localized damage to the corners of the silicon substrate, and forming a liner oxide on the sidewalls and floor of the isolation trench. In one embodiment, the active regions of the silicon substrate are displaced on either side of (i.e., laterally around) the isolation trench. The formation of the liner oxide is typically accomplished with a thermal oxidation process such that an oxidation rate of the silicon substrate is greater in the regions of localized damage than an oxidation rate in the remaining portions of the silicon substrate. In this manner, the silicon substrate corners are substantially rounded by the differential oxidation rates.

Preferably, the protective layer comprises a dielectric layer deposited on the silicon substrate prior to the formation of the isolation trench. In one embodiment, the protective layer further includes a photoresist layer patterned on an upper surface of the protective layer. The protective layer is preferably comprised of a chemically vapor deposited dielectric such as CVD oxide or CVD silicon nitride or a combination of both. The creation of the localized damage regions comprises, in a presently preferred embodiment, at least one ion implantation process performed at an implant angle in excess of approximately 30°. The ion implantation process, in one embodiment, includes at least one set of four implant steps. In this embodiment, the silicon substrate is rotated approximately 90° between each of the successive implants within the first set of four implants. The rotation of the silicon substrate ensures that the localized damage regions extend around all of the sidewalls of a dielectric trench.

The present invention still further contemplates a semiconductor process in which a mask is patterned over a dielectric formed on an upper surface of a silicon substrate. The patterned mask exposes portions of the dielectric that are situated over an isolation region of the silicon substrate. An etch process is then performed through the exposed portions of the dielectric and into the isolation region of the silicon substrate to form an isolation trench in the silicon substrate. A damaging species is then implanted into portions of the sidewalls of the isolation trench that are proximal to the silicon substrate upper surface. This implanting creates localized damage regions in the silicon substrate. Thereafter, a liner oxide is formed on the sidewalls and on the floor of the isolation trench with a thermal oxidation process to take advantage of the differential oxidation rate between the localized damage regions of the silicon substrate and the remaining portions of the silicon substrate.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of a silicon substrate upon which a dielectric layer comprising a silicon nitride layer over a CVD oxide layer has been formed;

FIG. 2 is a processing step subsequent to FIG. 1 in which a patterned photoresist mask is formed over the dielectric layer exposing portions of the dielectric layer situated over an isolation region of the silicon substrate;

FIG. 3 is a processing step subsequent to FIG. 2 in which an isolation trench has been etched through the dielectric layer and into the isolation region of the silicon substrate;

FIG. 4 is a processing step subsequent to FIG. 3 in which at least one ion implantation process is performed to create localized areas of damage to the silicon substrate at the silicon substrate corners;

FIGS. 5a through 5c depict various embodiments of the localized damage regions of FIG. 4;

Figure 6:
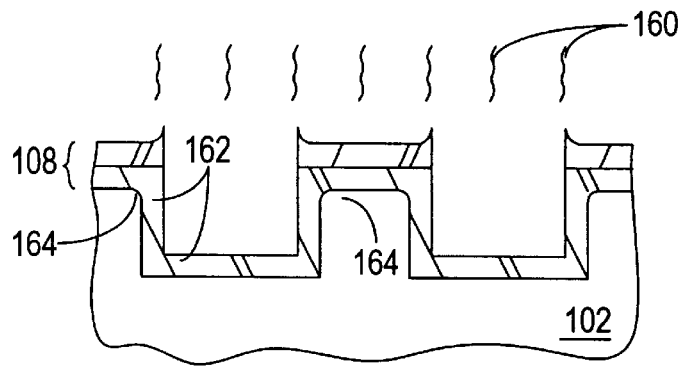
FIG. 6 is a processing step subsequent to FIG. 4 in which a liner oxide is formed on the sidewall and floor of an isolation trench with a thermal oxidation process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1–10 display a presently preferred processing sequence for fabricating an integrated circuit including a process for improving the gate oxide reliability at the edge of an isolation trench by rounding the silicon substrate at the isolation trench edge. Turning to FIG. 1, a silicon substrate 102 is shown. Silicon substrate 102 includes at least one isolation region 104 and at least one active region 106. Active region 106 is laterally adjacent to isolation region 104 as shown in FIG. 1. In a presently preferred embodiment useful in the fabrication of CMOS integrated circuits, a starting material for silicon substrate 102 preferably includes a p-type epitaxial layer formed over a p+ silicon bulk. A preferred resistivity of the epitaxial layer is in the range of approximately 10 to 15 $\Omega$-cm. The p+ silicon bulk (not shown in FIG. 1) typically includes an impurity distribution in excess of approximately $10^{19}$ atoms/cm$^3$. A dielectric layer 108 is shown as formed on an upper surface 101 of silicon substrate 102. In the embodiment of dielectric layer 108 shown in FIG. 1, dielectric layer 108 includes a CVD silicon oxide layer 110 formed on upper surface 101 of silicon substrate 102 and a CVD silicon nitride layer 112 formed on silicon oxide layer 110. The formation of silicon dioxide layer 110 is preferably accomplished by inserting a silicon substrate 102 into a chemical vapor deposition reactor chamber maintained at a temperature in the range of approximately 250° C. to 650° C. and introducing a suitable source such as TEOS or silane into the reactor chamber. The deposition of silicon nitride layer 112 is accomplished with widely known chemical vapor deposition techniques for depositing nitride layers. The silicon nitride layer 112 is useful in facilitating the selective oxidation of features formed within silicon substrate 102 as will be described in greater detail below. Silicon nitride layer 112 is typically not deposited directly on silicon substrate 102 because it is widely known that silicon nitride imparts undesirable stress when deposited directly upon a single crystal silicon lattice. Accordingly, CVD silicon oxide layer 110 serves as a pad oxide layer as will be appreciated to those skilled in the art of semiconductor fabrication.

Turning now to FIG. 2, a patterned mask layer 114 is formed on an upper surface of dielectric layer 108. Patterned mask layer 114 exposes an upper surface 115 of portions 116 of dielectric layer 108 that is situated over isolation region 104 of silicon substrate 102. In a presently preferred embodiment, patterned mask layer 114 comprises a conventional patterned photoresist layer formed using conventional photolithography and photoresist processing steps.

Turning now to FIG. 3, an isolation trench 130 is formed in silicon substrate 102. The isolation trench 130 is preferably achieved in a single pump down plasma etch process in which the dielectric layer 108 is etched during an initial phase of the plasma etch process and the portions of isolation region 104 silicon substrate are removed during a second phase of the plasma etch process. In a presently preferred embodiment, the etch process used to form isolation trench 130 results in the formation of trench sidewalls 132a and 132b (collectively referred to hereinafter as sidewalls 132) and a trench floor 134. If a suitable anisotropic etch process is used, sidewalls 132 are substantially perpendicular to upper surface 101 of silicon substrate 102. Accordingly, corners 136 are formed on silicon substrate 102 by the process used to create isolation trench 130. The corners 136 of concern for the purposes of the present application are located at the intersection of upper surface 101 of silicon substrate 102 and sidewalls 132 of isolation trench 130. It is theorized that conventionally formed integrated circuits which typically include a gate dielectric layer such as a thermal oxide are susceptible to failure of the gate dielectric layer proximal to the isolation trenches. It is theorized that, among other factors, the severity of the topography of silicon substrate 102 at the corners 134 can result in the generation of electric fields significantly in excess of the electric fields generated in portions of the active region of silicon substrate 102 farther away from the isolation structure. Accordingly, the present invention contemplates that it is advantageous to reduce the severity of the silicon substrate topography proximal to the isolation trench. In other words, it is desirable to incorporate a process which results in substantial rounding of the corners 136 of silicon substrate 102.

Turning now to FIG. 4, localized regions 144 of lattice damage are created in silicon substrate 102 proximal to the corners 136. In a presently preferred embodiment, the localized damage regions 144 are created using at least one ion implantation process represented by the reference numerals 140 and 142. In one embodiment, at least one ion implantation process is performed using an implant angle in excess of approximately 30° off perpendicular, wherein perpendicular is measured from the planar surface of the topological features. By incorporating an angled implant, the present invention takes advantage of the shadowing effect produced by the presence of patterned masking layer 114 and dielectric layer 108 over silicon substrate 102. This shadowing effect substantially limits the ion implantation processes 140, 142 to the upper portions of sidewalls 132 of isolation trench 130. In one embodiment, a first set of implantation processes is performed with patterned mask layer 114 still present upon dielectric layer 108. The presence of patterned mask layer 114 coupled with a selectively chosen implant angle results in a relatively narrow damage region 144. In another embodiment, patterned mask layer 114 is removed prior to a first set of ion implant processes. In this embodiment, the absence of patterned mask layer 114 results in a damage region 144 which extends relatively further down sidewalls 132 of isolation trench 130. FIGS. 5a through 5c are exploded views of silicon substrate 102 in the vicinity of a corner 136. FIG. 5a is representative of a damage area pattern produced by an implant sequence in which patterned mask layer 114 is removed prior to the ion implants. FIG. 5b, in comparison, represents the damage profile formed by a process in which the ion implants are performed prior to the removal of patterned mask layer 114. Finally, FIG. 5c shows a combination of FIGS. 5a and 5b. In this embodiment, it is contemplated that a first set of ion implantation processes is performed prior to the removal of patterned mask layer 114 and a second set of ion implantation processes is performed at the rate of removal of patterned mask layer 114. It is theorized that by adjusting the heights of dielectric layer 108 and patterned mask layer 114 and by suitably adjusting the implant angle used for each set of ion implant processes that the present invention is capable of producing a wide variety of damage area patterns in silicon substrate 102. Because the ion implantation process described with respect to FIG. 4 are performed at significant implant angles, substantial shadowing will occur as will be appreciated to those skilled in ion implantation processes. To eliminate the undesired shadowing effects associated with the highly angled implant, it is contemplated that in one embodiment of the present invention, each set of ion implantation processes will include multiple implants in which the silicon substrate is rotated between each implant of the sequence. For example, it is contemplated that, in one embodiment, each set of ion implantation processes will include four implant steps wherein the silicon substrate 102 is rotated 90° between each implant. In this manner, the shadowing effects associated with highly angled implants can be substantially reduced or eliminated.

The ion implantation processes result in effective amorphization of silicon substrate 102. To create this artificially formed amorphous silicon, it is desirable to execute the ion implantation processes 140, 142 using an implant energy in the range of approximately 50 to 200 keV using an implant species that is electrically neutral and has sufficient atomic mass to accomplish the desired amorphization. Suitable implant species meeting these criteria include, for example, silicon, germanium, and argon. A suitable implant dose used to create these localized damage regions 144 is preferably greater than approximately $1 \times 10^{14}$ atoms per/cm$^2$. in a presently preferred embodiment, it is contemplated that the localized damage regions extend downward from upper surface 101 of silicon substrate 102 to a depth in the range of approximately 100 to 1000 angstroms.

Turning now to FIG. 6, a liner oxide 162 is formed on sidewalls 132 and trench floor 134 of isolation trench 130 using a thermal oxidation process represented in FIG. 6 by reference numeral 160. In the preferred embodiment, the thermal oxidation process 160 includes immersing silicon substrate 102 into an oxygen bearing ambient maintained at a temperature in the range of approximately 500° C. to 900° C. for a duration in the range of approximately 2 to 20 minutes, for example. Because of the presence of the silicon nitride layer 112 within dielectric layer 108, the liner oxide 162 forms selectively on sidewalls 132 in trench floor 134 of isolation trench 130. The presence of localized damage regions 144 proximal to corners 136 of silicon substrate 102 results in a differential oxidation rate between the silicon substrate in the vicinity of the localized damage regions and oxidation rate of the silicon substrate elsewhere. More specifically, it is theorized that the amorphized silicon regions will tend to oxidize at a faster rate than where the silicon lattice is relatively intact. The higher oxidation rate associated with the damage silicon regions will tend to effect a rounding of corners 136 of silicon substrate 102. These rounded corners are represented by reference numeral 164 in FIG. 6. It is believed that the rounded corners 164 of silicon substrate 102 formed according to the present invention improve device reliability by providing a smoother transition between sidewalls 132 and upper surface 101 of silicon substrate 102. In one embodiment, the quality of the liner oxide 162 may be beneficially improved by incorporating a nitrogen bearing species into the oxygen bearing ambient used in the formation of liner oxide 162.

Figure 7:
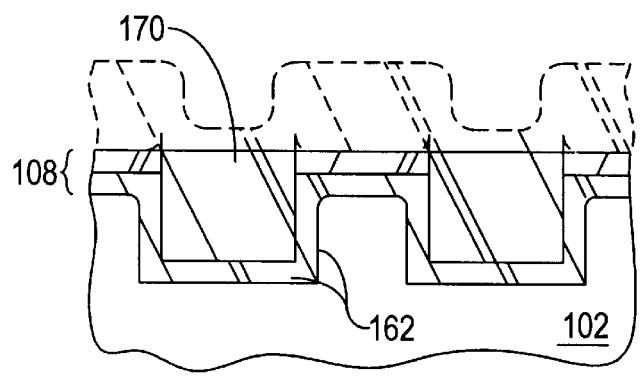
FIG. 7 is a processing step subsequent to FIG. 6 in which the isolation trenches have been filled with a CVD dielectric and subsequently planarized to produce a substantially planar upper surface.

Turning now to FIG. 7, isolation trench 130 is filled with an isolation dielectric typically through the use of a CVD silicon dioxide deposition process. In the preferred embodiment, isolation dielectric 170 is formed with a plasma enhanced CVD process using a TEOS source. After the deposition of trench dielectric 170, a planarization process is typically performed to remove non-planar surfaces from the trench dielectric material. Portions of the deposited trench dielectric material removed during the planarization process are represented in phantom in FIG. 7. A suitable planarization process used to produce the cross-section shown in FIG. 7 includes a chemical mechanical polish process that utilizes the presence of a silicon nitride layer as an etch stop. Other suitable planarization processes including, for example, resist/etchback techniques may be used as well.

Figure 8:
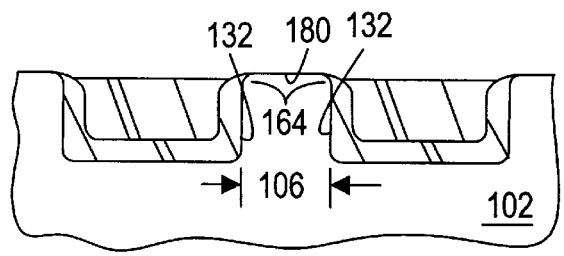
FIG. 8 is a processing step subsequent to FIG. 7 in which the dielectric layer comprising the CVD oxide and the CVD silicon nitride have been removed and further planarization accomplished to produce a substantially planar upper surface.

Turning now to FIG. 8, further planarization is performed to remove dielectric layer 108 and additional portions of trench dielectric 170 to finally expose upper surface 180 of active region 106 of silicon substrate 104. In addition to the planarization processes, upper surface 180 is further prepared for a subsequent oxidation step typically through the use of well known cleaning steps including, for example, an RCA clean process. Accordingly, the cross-section of FIG. 8 shows upper surface 180 of active region 106 transitioning into the corner regions 164 of silicon substrate 102 and finally into sidewalls 132 of the isolation trench.

Figure 9:
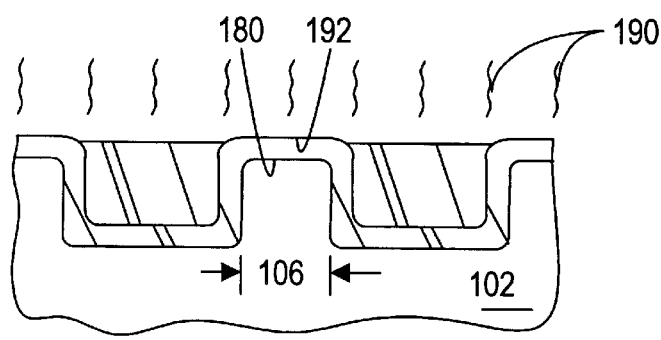
FIG. 9 is a processing step subsequent to FIG. 8 in which a gate oxide is formed over active regions of the silicon substrate with a thermal oxidation process.

Turning now to FIG. 9, a gate oxide process represented in FIG. 9 by reference numeral 190 is performed to grow a gate oxide layer 192 over upper surface 180 of active region 106. In a presently preferred embodiment, gate oxidation process 190 includes the immersion of silicon substrate 102 into an oxygen bearing ambient maintained at a temperature in the range of approximately 500° C. to 900° C. for a duration in the range of approximately 2–20 minutes to form a gate oxide 192 having a thickness in the range of approximately 15 to 50 angstroms. Gate oxidation 190 may further include, in one embodiment, the incorporation of a nitrogen bearing species into the oxygen bearing ambient to produce a nitrogen bearing gate oxide. In this embodiment, the desirability of incorporating nitrogen into the gate oxide 192 originates in the belief that the nitrogen provides a significant barrier to mobile impurities thereby increasing the reliability and long term stability of the device, particularly in the p-channel regions of a CMOS integrated circuit in which the gate electrode typically includes highly mobile impurity such as boron. Gate oxide 192 as shown in FIG. 9 substantially terminates proximal to corner regions 164 in the vicinity of the isolation structure within silicon substrate 102. As discussed previously, it is believed that the rounded corners 164 will improve the long term reliability of gate dielectric 192 by reducing the severity of the maximum electric field induced in the vicinity of the isolation structure where a strong potential gradient exists.

Figure 10:
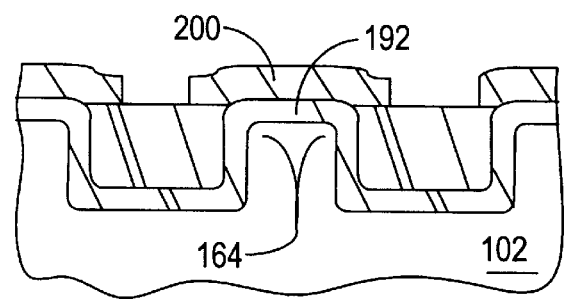
FIG. 10 is a processing step subsequent to FIG. 9 in which conductive gate structures are formed over the gate oxide structures.

Finally, turning to FIG. 10, a gate electrode 200 is formed over gate dielectric 192. The preferred process for fabricating gate electrode 200 includes thermally decomposing silane in a chemical vapor deposition reactor chamber maintained at a temperature in the range of approximately 580° C. to 650° C. to deposit polysilicon on an upper surface of silicon substrate 102. Thereafter, impurities are typically introduced into the as deposited polysilicon to reduce a sheet resistivity of the polysilicon to less than approximately 500 Ω per square. A preferred method of introducing these impurities into the as deposited polysilicon include ion implanting species of boron, arsenic, or phosphorous into the polysilicon. In another embodiment, gate dielectric 200 may comprise aluminum, copper, tungsten or other suitable conductive material. After the deposition and appropriate doping of the gate electrode, a photolithography and etch process is performed to pattern the deposited polysilicon layer into a plurality of gate electrodes. Thereafter, ion implant processes are used to fabricate source/drain regions in silicon substrate 102 as will be appreciated to those skilled in the art of transistor fabrication.

It will be appreciated to those skilled in the art that the present invention contemplates a method of improving device reliability by smoothing a transition between an upper surface of the silicon active region and a sidewall of the isolation trench through the use of an ion implantation process used to introduce localized damage to the single crystal silicon lattice at the corners of the silicon substrate adjacent to the isolation trenches.

While the present invention has been described with respect to the drawings and detailed description, obvious modifications to the preferred embodiment may be readily apparent to those skilled in the art, the present invention is intended to encompass all such obvious modifications and the accompanying claims are intended to be interpreted broadly to include all such modifications and changes.

What is claimed is:

1. A semiconductor fabrication process, comprising:

creating a trench within a silicon substrate, wherein the trench includes a corner at an upper surface of the substrate;

creating localized damage to said corner of said silicon substrate by implanting electrically neutral ion species at an angle in excess of approximately 30° from an angle perpendicular to the substrate upper surface;

forming a liner oxide on sidewalls and on a floor of said isolation trench with a thermal oxidation process, wherein an oxidation rate of said silicon substrate is greater in said regions of localized damage than an oxidation rate in remaining portions of said silicon substrate whereby said thermal oxidation process performs rounding of the corner of said silicon substrate; and filling said isolation trench with an isolation dielectric.

2. The process of claim 1, wherein a starting material for said silicon substrate comprises a p-type epitaxial layer formed on a p+ silicon bulk, wherein a resistivity of said epitaxial layer is in the range of approximately 10 to 15 $\Omega$-cm.

3. The process of claim 1, further comprising patterned photoresist used to form the trench.

4. The process of claim 1, where said ion implantation process utilizes an implant species comprising silicon, germanium, or argon.

5. The process of claim 1, wherein said ion implantation process is accomplished with an implant energy in the range of approximately 50 to 200 keV.

6. The process of claim 1, wherein said localized damage is confined to portions of said silicon substrate proximal to upper portions of said isolation trench sidewalls.

7. The process of claim 1, wherein said creating of said localized damage comprises:

a first set of ion implantation processes performed at an implant angle in excess of approximately 30° with a patterned mask in place upon a dielectric-spaced distance above the substrate; and a second set of ion implantation processes performed at an implant angle in excess of approximately 30° after removing said patterned mask.

8. A semiconductor process for rounding corners of a silicon substrate, wherein said corners comprise portions of said silicon substrate proximal to an upper surface of said silicon substrate and proximal to sidewalls of an isolation trench formed in said silicone substrate, said process comprising:

forming a protective layer over active regions of said silicon substrate, wherein said active regions of said silicon substrate are displaced on either side of said isolation trench;

creating localized damage to said corners of said silicon substrate by implanting electrically neutral ion species at an angle in excess of approximately 30° from an angle perpendicular to the substrate upper surface; and forming a liner oxide on said sidewalls and on a floor of said isolation trench with a thermal oxidation process, wherein an oxidation rate of said silicon substrate is greater in said regions of localized damage than an oxidation rate in remaining portions of said silicon substrate whereby said silicon substrate corners are substantially rounded.

9. The process of claim 8, wherein said protective layer comprises a dielectric layer deposited on said silicon substrate prior to the formation of said isolation trench.

10. The process of claim 9, wherein said protective layer further comprises a photoresist layer.

11. The process of claim 8, wherein said ion implantation processes includes at least one set of four implant steps wherein said silicon substrate is rotated 90° between each successive implant.

* * * * *